United States Patent [19]

Ramberg et al.

[11] Patent Number: 5,518,548
[45] Date of Patent: May 21, 1996

[54] DEPOSITION BARRIER

[75] Inventors: Randy J. Ramberg, Roseville; Carl D. Anderson, Prior Lake, both of Minn.

[73] Assignee: Honeywell Inc., Minneapolis, Minn.

[21] Appl. No.: 511,030

[22] Filed: Aug. 3, 1995

[51] Int. Cl.[6] .................................................. C23C 14/00
[52] U.S. Cl. ............................................ 118/726; 118/715
[58] Field of Search ..................................... 118/715, 726

[56] References Cited

U.S. PATENT DOCUMENTS 5,133,286  7/1992  Choo ...................................... 118/726

*Primary Examiner*—Richard Bueker

[57] ABSTRACT

Deposition sources deposit material onto mirrors used in ring laser gyros. The mirrors are placed in a rotating apparatus called a planet which rotates above the deposition sources which emit the material upwards. This operation will result alternating, multiple layers of the differing materials deposited onto the mirror. A barrier placed between the deposition sources prevents material from being deposited at high angles which increases the efficiency and ideal operability of the mirrors in the ring laser gyro.

10 Claims, 3 Drawing Sheets

DEPOSITION BARRIER

BACKGROUND OF THE INVENTION

1. Field of the Invention

The present invention relates to the creation of mirrors for ring laser gyros and more particularly to the deposition of materials to create the mirrors.

2. Description of the Prior Art

Mirror characteristics are very important in the operation of ring laser gyros. It is important in ring laser gyros to maintain the intensity of the laser beams in the ring laser gyro. The intensity of the laser beams can depend on the characteristics of the mirrors and will remain strong if the mirrors are highly reflective. Further, by utilizing highly reflective mirrors, the ring laser gyro can operate more efficiently by saving excessive power that may be required in keeping the laser beams strong. Mirror characteristics are largely governed by the orientation of the substrate with the respect to material deposited on the substrate. If the orientation of the material on the mirrors is correctly aligned, the light beams may reflect with all their intensity and laser beams will not be weakened. As mentioned before, this would reduce the power necessary to operate the gyro.

To fabricate ring laser gyro mirrors, known deposition techniques are used to deposit material onto substrates in a coating chamber. Deposition sources exist in a coating chamber. High energy electrons are emitted from the deposition sources and strike a target material. The target material is then evaporated onto mirror substrates that exist above the target material. However, during the deposition, the target material is deposited at high angles. High angles are referenced with 0 degrees at the normal to the surface of the mirror substrate. As mentioned before, it is highly important that the orientation be such that mirrors are coated with orientations that will provide optimal mirror characteristics to keep the laser beam intensity in the ring laser gyro.

Deposition of material at high angles results in mirrors with high offset, loss and scatter. In the RLG, it is desirable for a light beam to reflect perfectly wherein the intensity of the beam is maintained and the beam is reflected at the same angle as its incoming angle or incidence angle. Generally, some part of the beams do not reflect properly and some of the original beam reflects at undesirable angles. This is commonly referred to as scatter.

Sometimes it is necessary to create partially reflective mirrors in which some of the original beam to be transmitted through the mirror while the remainder is to be reflected. However, some of the light beam desired to be transmitted through the material on the mirrors is instead absorbed by the material on the mirrors. Absorbed light gives off energy or heat which results in the loss of these photons. This phenomena is commonly referred to as loss. Scatter is also considered a part of loss.

Offset is the amount of uneven stress on a mirror substrate. In mirrors, stresses exist in multiple directions at fight angles. If the stresses are equal, they cancel each other out and no offset exists. If no stresses exist, then of course no offset exists. However, if the stresses are unequal, offset exists causing losses in the mirror. More specifically, when a light beam strikes the mirror, the light beam loses some of its energy. This is a problem because it is desirable to keep the beams strong and not lose any energy.

To reduce offset, loss and scatter, it would be beneficial to prevent material from being deposited at high angles. Consequently, the laser beam in the ring laser gyro would remain strong and the ting laser gyro would operate more efficiently by requiring less energy.

SUMMARY OF THE INVENTION

The present invention is an apparatus to prevent undesirable substrate deposition for mirror substrates that are used in ring laser gyros. In coating chambers, multiple deposition sources exist to deposit multiple layers of different material on a substrate. The substrates are placed in planets which rotate above the deposition sources as material is deposited onto the substrate. The rotation of the planets will allow for a homogenous coating of alternating layers of material to be deposited. A barrier is placed in this coating chamber between the deposition sources so that undesirable high angle substrate deposition is prevented. With the use of the barrier, deposition at high angles is blocked by the barrier so that material is not deposited at high angles onto the mirror substrates.

DETAILED DESCRIPTION OF THE PRESENT INVENTION

Figure 1:
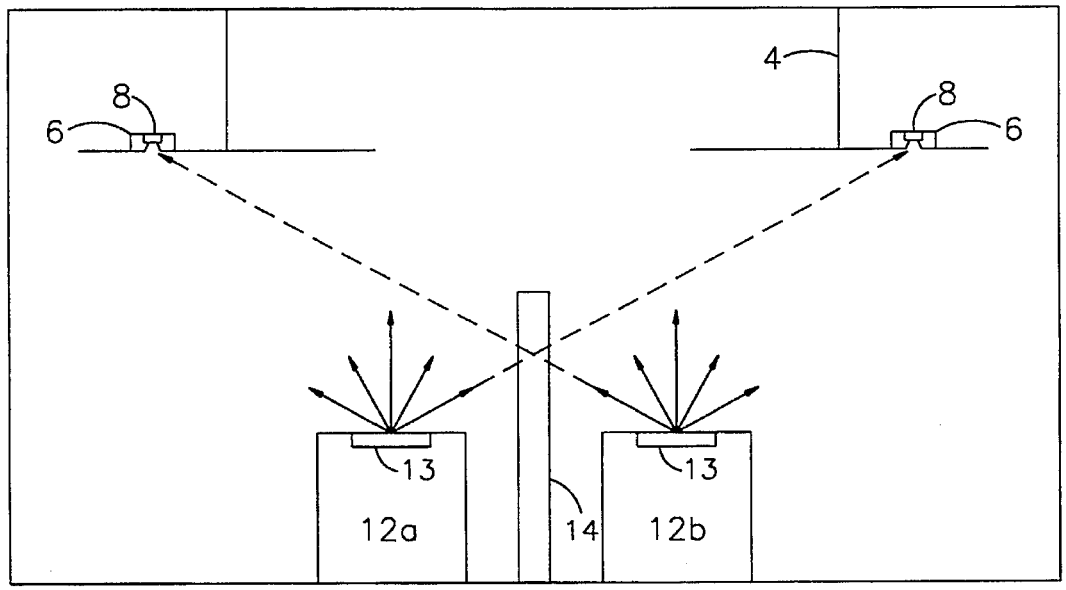
FIG. 1 is a side view of a coating chamber with a deposition barrier.

In an electron beam deposition coating chamber 2 as seen in FIG. 1, planets 4 exist with deposition masks 6. The substrate 8 to be coated is placed in the deposition masks 6. A first and second target source 12a and 12b exist below the planets which emit material to be coated onto the substrate 8. The sources 12 emit different material which is placed on top of the sources 12. The sources 12 hold the material 13 and contains the elements that perform electron beam deposition. As is well known in electron beam deposition, electrons that are very high in energy are shot at the source material 13. Once the electrons hit the source material 13, the source material 13 is evaporated on the substrate. An analogy to better understand this form of deposition is the placing of something of high temperature in water. The water evaporates and a steam is shot upwards. The water then forms condensation on what it touches. The condensation example is also a good analogy for how the source material 13 forms on the substrate 8.

Electron beam deposition is one form of deposition that can be used with the present invention. However, many forms of deposition can be used with the present invention such as ion beam deposition, chemical vapor deposition as well as other forms of deposition. The present invention will be discussed in its use with electron beam deposition as one illustration of an embodiment of the present invention, but is not limited to use with only electron beam deposition.

The purpose for a first and second source 12 is to create a multi-layer coating on the substrate 8. However, many sources can be used depending on how many differing layers are desired for coating the substrate 8.

The planets 4 are then rotated around the coating chamber 2 to create a homogenous, alternating, multi-layer coating. The sources 12 emit different materials and due to the rotation of the planets 4, alternating layers of the different materials are deposited on the substrate 8. Once the material hits the substrate 8 it forms a coating on the substrate 8. However, due to the set up in the chamber 2, high angle deposition of the material onto the substrate 8 occurs. Again, high angle deposition is referenced with 0 degrees at the normal to the surface of the substrate 8. This is not beneficial since coating at a high deposition angle causes offset, loss and scatter in the mirror. A barrier 14 is appropriately placed to prevent high angle deposition. A good height for the barrier 14 should be such that angles of deposition greater than 40° are prevented. Different size and shaped barriers 14 can be used according to space requirements.

Figure 2:
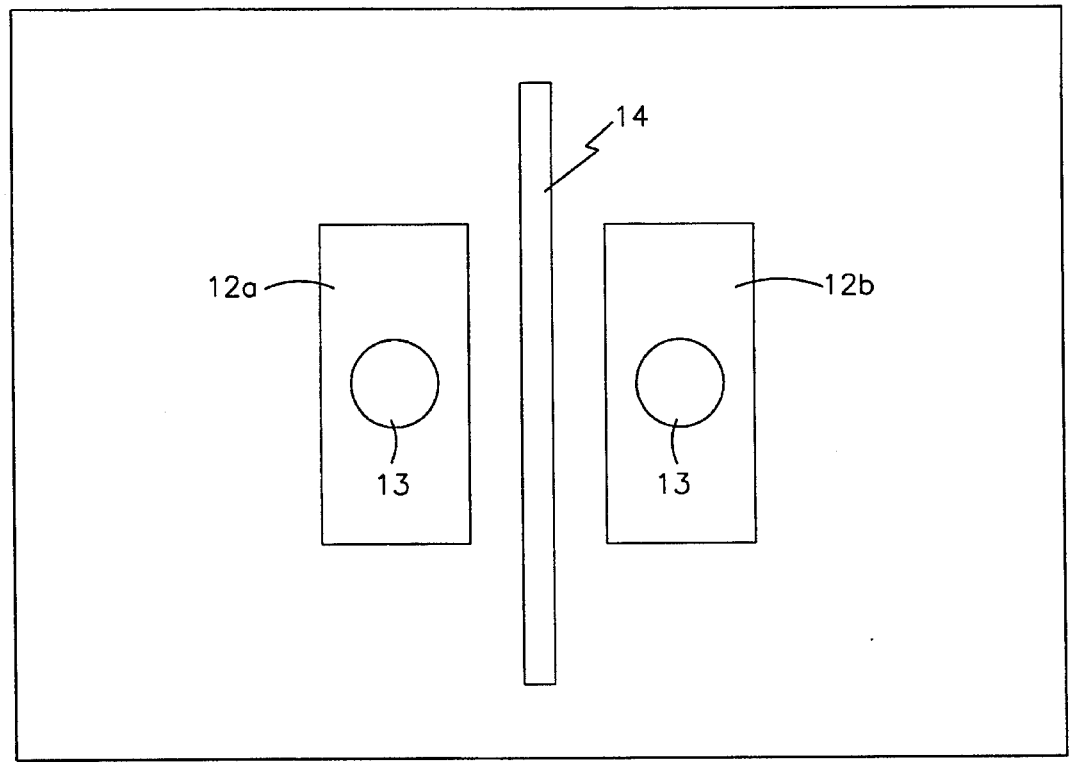
FIG. 2 is a top view of a rectangular deposition barrier in a coating chamber.

FIG. 2 shows a top view of the electron beam sources 12 and the source material 13 that exists on the sources 12. Between the sources 12 is a rectangular-shaped barrier 14. This rectangular barrier 14 is a cheap and easy way to prevent high angle deposition.

Figure 3:
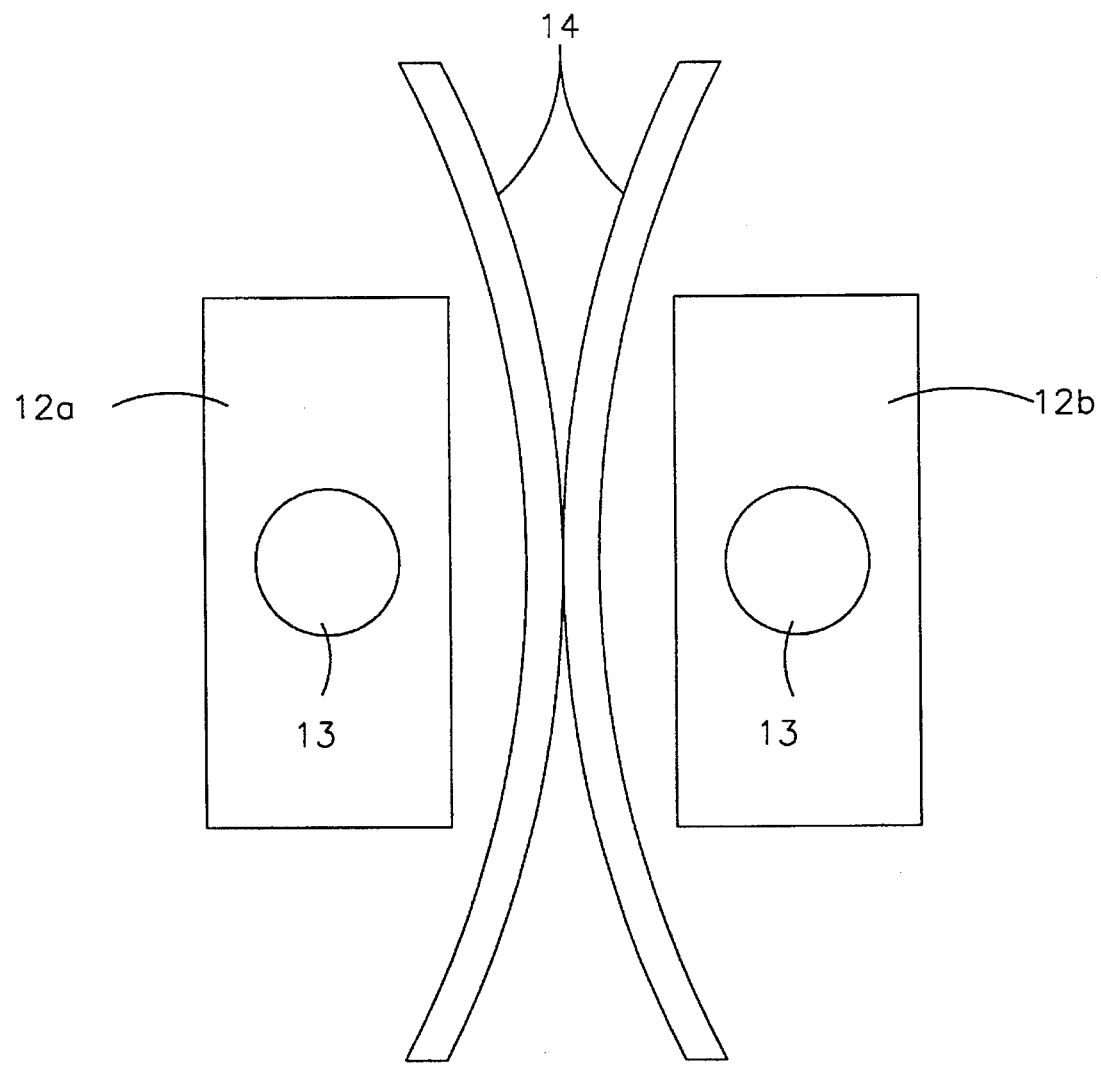
FIG. 3 is a top view of a curved deposition barrier in a coating chamber.

FIG. 3 shows a top view of another possible shape that can be used for the barrier 14. The curve shaped barrier 14 prevents undesirable deposition when the planets 4 are at a point in their rotation where high angle deposition could occur. The curve shaped barrier has advantages over the rectangular barrier in that it "cuts off" higher angle deposition. Obviously, the more high angle deposition prevented the better. However, more time and money is required in producing the curve shaped barrier 14 than the rectangular barrier since the curve shaped barrier needs to be shaped.

Figure 4:
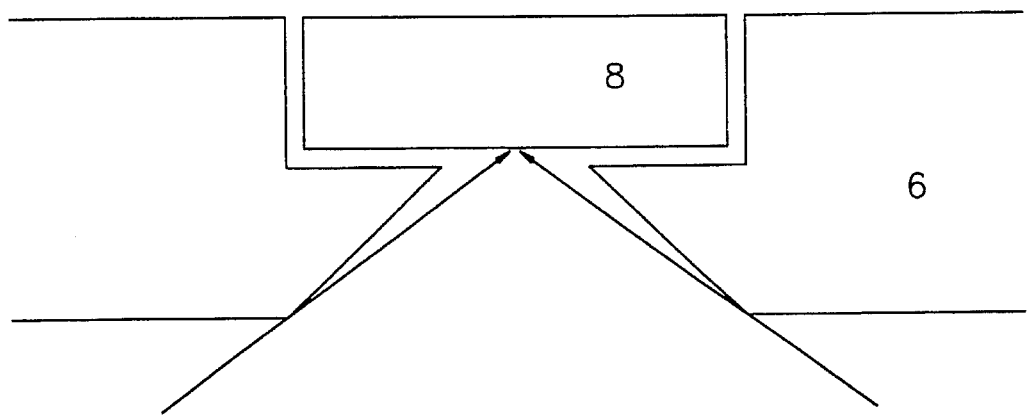
FIG. 4 is a side view of material being deposited onto a substrate in the coating chamber.

Also, to assist in preventing high angle deposition, raising the substrate 8 off the deposition mask 6 prevents almost all of the high angle deposition. FIG. 4 shows high angle deposition that occurs presently. The arrows represent the material being emitted from the sources 12 to the substrate 8. As can be seen, the substrate 8 was previously hit at high angles. As mentioned before, high angle deposition results in high offset, loss and scatter.

Figure 5:
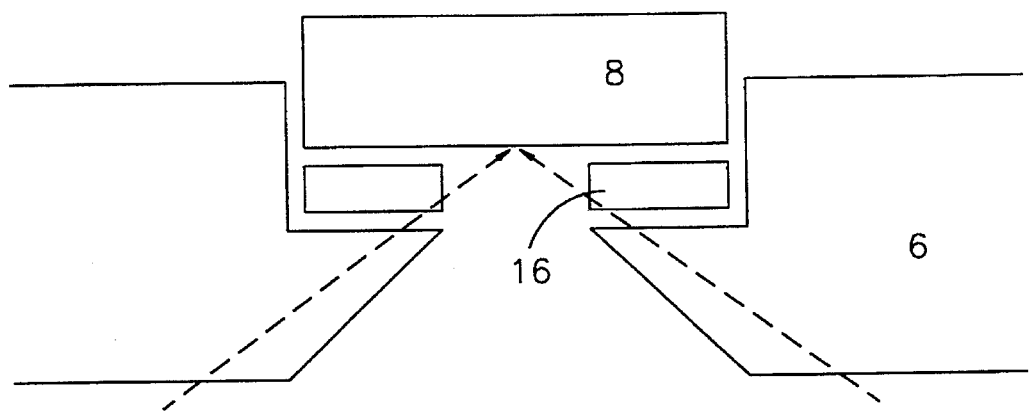
FIG. 5 is a side view of material being deposited onto a substrate with spacers in the coating chamber.

FIG. 5 shows the use of a spacer 16, about 6 mm, to lift the substrate 8 from the deposition mask 6 so that high angle deposition is prevented. In the present embodiment, the spacer is approximately 6 mm high, however the dimensions could vary greatly in each application. As mentioned above, the arrows represent the material emitted from the sources 12. The material emitted at high angles now misses the substrate 8. A kapton washer can be used as a spacer 16. A kapton washer would be a preferred embodiment to prevent scratching of the substrate 8. However, any type of spacing means could be used as the spacer 16.

The invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

The embodiments of the invention in which an exclusive property or right is claimed are defined as follows:

1. Apparatus to prevent undesirable deposition on a substrate in a deposition chamber comprising:

a plurality of different deposition sources which deposit differing material onto the substrate;

a plurality of planets that exist above the plurality of different deposition sources with deposition masks that hold the substrate and rotate in the deposition chamber to coat the substrate with alternating layers of material from the different deposition sources; and a barrier placed between the different deposition sources to prevent the deposition sources from coating the substrate in an undesirable deposition.

2. The apparatus of claim 1 wherein the barrier is of a height such that deposition at 40° or more is prevented.

3. The apparatus of claim 1 wherein the barrier has a shape of a rectangle with the barrier resting on the long side of the rectangle.

4. The apparatus of claim 1 wherein the barrier has a curved shape curving slightly around the deposition sources.

5. The apparatus of claim 1 further comprising a spacing apparatus placed in the deposition masks to lift the substrate from the deposition masks so that undesirable deposition is prevented.

6. Apparatus to prevent high angle electron beam deposition on a substrate in a deposition chamber comprising:

a first deposition source which deposits material onto the substrate;

a second deposition source which deposits material different from the first deposition source onto the substrate;

a plurality of planets that exist above the first deposition source and the second deposition source with deposition masks that hold the substrate and rotate in the deposition chamber to coat the substrate with alternating layers of material from the first deposition source and the second deposition source; and a barrier placed between the first deposition source and the second deposition source to prevent the first deposition source and the second deposition source from coating the substrate in a high angle deposition.

7. The apparatus of claim 6 wherein the barrier is of a height such that deposition at 40° or more is prevented.

8. The apparatus of claim 6 wherein the barrier has a shape of a rectangle with the barrier resting on the long side of the rectangle.

9. The apparatus of claim 6 wherein the barrier has a curved shape curving slightly around the first deposition source and the second deposition source.

10. The apparatus of claim 6 further comprising a spacing apparatus placed in the deposition masks to lift the substrate from the deposition masks so that high angle deposition is prevented.

* * * * *